(12) United States Patent
He et al.

(10) Patent No.: US 6,859,151 B2
(45) Date of Patent: Feb. 22, 2005

(54) DIGITAL DATA TRANSFORMING METHOD

(75) Inventors: Dake He, Chengdu (CN); Wei He, Chengdu (CN)

(73) Assignee: Southwest Jiaotong University, Chengdu (CN)

( * ) Notice: Subject to any disclaimer, the term of this patent is extended or adjusted under 35 U.S.C. 154(b) by 0 days.

(21) Appl. No.: 10/240,707

(22) PCT Filed: Apr. 26, 2001

(86) PCT No.: PCT/CN01/00615

§ 371 (c)(1),
(2), (4) Date: Dec. 10, 2002

(87) PCT Pub. No.: WO02/33828

PCT Pub. Date: Apr. 25, 2002

(65) Prior Publication Data

US 2003/0152220 A1 Aug. 14, 2003

(30) Foreign Application Priority Data

Apr. 28, 2000 (CN) .......................... 00112884 A

(51) Int. Cl.$^7$ .............................................. H03M 7/00
(52) U.S. Cl. ........................................ 341/50; 341/51
(58) Field of Search ............................. 341/55, 106, 50, 341/51; 707/10

(56) References Cited

U.S. PATENT DOCUMENTS

| | | | | |
|---|---|---|---|---|
| 5,389,924 A | * | 2/1995 | Ogawa ........................ | 341/106 |
| 5,682,158 A | * | 10/1997 | Edberg et al. ............... | 341/90 |
| 5,687,366 A | * | 11/1997 | Harvey et al. ............... | 707/10 |
| 5,929,792 A | | 7/1999 | Herriot ........................ | 341/55 |

FOREIGN PATENT DOCUMENTS

EP        0717374        6/1996

\* cited by examiner

*Primary Examiner*—Jean Bruner Jeanglaude
(74) *Attorney, Agent, or Firm*—Ladas & Parry

(57) ABSTRACT

A coding transformation method includes the steps of dividing an input data into blocks with the length of 13 bits, where the original data set X includes all 8192 13-bit symbols and 12 filling-bit symbols, and uses 91 printable characters in the output representation of the input data. The output set Y is a sub-set of the direct product R91×R91, with R91 being a set of 91 printable ASCII characters. The reversible coding mapping relationship is $$\text{Base91}[x] = (ch1, ch2) = (R91\_CH[x/91], R91\_CH[x\%91])$$

Figure 1:
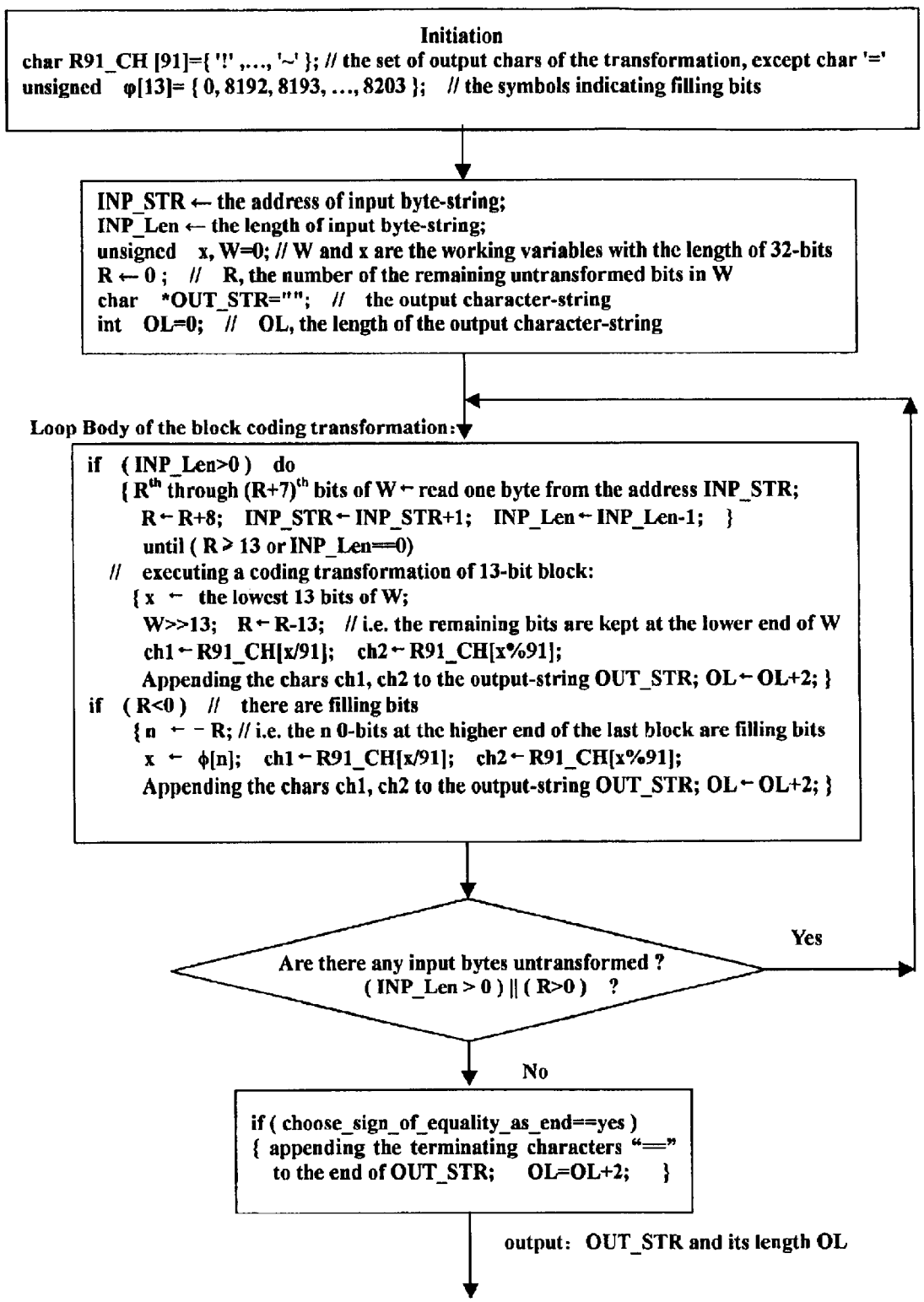

where $x \in X$, $ch1, ch2 \in R91$. For an input data block less than 13-bits long, n bits are added to the specified side to make it become a complete block with the image of the block of data in the direct product R91×R91.

4 Claims, 1 Drawing Sheet

DIGITAL DATA TRANSFORMING METHOD

FIELD OF INVENTION

The present invention relates to the field of information processing, in particular to the field of digital data encoding/decoding transformation technology in conjunction with data encryption and data compression.

BACKGROUND OF INVENTION

With the rapid development of Internet and its business application, E-mail and its security has become more and more important. SMTP (Simple Mail Transfer Protocol) is the basic electronic mail transfer protocol. All the SMTP-based E-mail encrypting system PGP (Pretty Good Privacy), PEM (Privacy Enhanced Mail), and MIME (Multipurpose Internet Mail Extensions) or S/MIME (secure MIME) can provide compatibility with the E-mails. So-called compatibility with the E-mails is to transform arbitrary 8-bit data byte-strings or arbitrary bit stream data transferred by the E-mail into the character-strings of a limited ASCII (American Standard Code for Information Interchange). The main limitation on the latter is that: (1) the characters have to be printable; (2) the characters are not control character or "-" (hyphen). There are totally 94 of such ASCII characters, their corresponding digital coding being all integers ranging from 32 through 126 with the exception of 45. E-mails written in these ASCII characters are compatible with the Internet standard SMTP, and can be transferred in nearly all the E-mail systems. Nowadays, to provide compatibility with the E-mail, Base64 coding or QP (Quoted-Printable) coding is usually employed.

Base64 coding divides the input message M into blocks 6-bit long to be used as variable to implement mapping, the mapping is denoted by Base64[ ]:$X \rightarrow Y$ wherein the variable or original image set X includes all 64 6-bit long symbols (denoted as integers 0, 1, . . . , 63) and $\Phi$ representing "no data"; the image set Y includes the upper and lower cases of 26 alphabetic characters, Arabic digits ranging from 0 through 9, "+", "/" and filling character "=" wherein it is specified that in the non-program statements the Chinese quotation marks are used as the delimiter of characters or character-strings (the following is the same). Mapping rules commonly used in Base64 coding software are Base64[0]="A", . . . , Base64[25]="Z", Base64[26]="a", . . . , Base64[51]="z", Base64[52]="0", . . . , Base64[61]="9", Base64[62]="+", Base64[63]="/"

Particularly, Base64[$\Phi$]="=" is used only when needed so as to make the total number of characters of output of the transformation equal to the multiples of 4. The coding efficiency of Base64 coding is 6/8=75%, the data expansion rate is 8/6=4/3=133.33%.

QP coding divides the input message M into blocks 8-bit long to be used as variable to implement mapping, when the original image 8-bit data is non-"=" printable character, its image equal to the original image (i.e. there is no change); when the hexadecimal notation of the original image 8-bit data is "LR" and the most significant bit is 1, its image is three printable characters "=LR"; while the image of " " is "=3D". Hence, in the worst case, the coding efficiency of QP transformation is ⅓ and the data expansion rate is 300%, (this is the case when Chinese data employing coding GB2312 are being QP-transformed).

Contents of Invention

The object of the present invention is to provide a digital data transformation method to replace Base64 coding or QP coding, so as to provide higher coding efficiency under the condition of E-mail compatibility, to reduce the time requirement for transferring coded messages over the network, or to save storage space when the data are stored using printable character mode.

The present invention will be implemented by the following technical design: the coding transformation of arbitrary bit stream data into printable character sequence. The main idea is: to increase the bit length of the block mapping of the input message M from the current 6 or 8 bits to 13 bits, and to use the double-character set of 91 printable ASCII characters as the image set for the transformation. The followings are the Base91 coding designed for the present invention (also denoted as Radix-91 coding, wherein Base91 and Radix-91 are two conventional English names of "base number-91").

Base91 coding divides the input message M into blocks 13-bit long to be used as variable to implement mapping, the mapping is denoted by Base91 [ ]:$X \rightarrow Y$ wherein the variable or original image set X includes all 8192 13-bit long symbols (denoted as integers 0, 1, . . . , 8191) and symbols $\Phi$n (n=1, . . . ,12), $\phi1$=8192, . . . , $\phi12$=8203, denoting that the n-bit data at the specified side of the last block are used as the filling data, thereby making the total number of elements in the original image set equal to 8204; the image set Y is the sub-set of the direct product of R91×R91, wherein the symbol R91 denotes the set of 91 characters selected from the 95 printable ASCII character set with "−", "=", "." and space character excluded, the direct product R91×R91 has 8281 elements.

Base91 is defined as an injective mapping arbitrarily selected from X into the direct product R91×R91. The selection of any particular injective mapping as Base91 has no effect on the present invention. For the convenience of implementation, assuming that R91_CH[91] is the character set that includes all R91 characters and is arranged according to the ASCII sequential order, the present invention preferably selects the following mapping:

Base91[x]=(ch1, ch2)=(R91_CH[x/91], R91_CH[x%91])　　(1)

wherein x∈X, ch1,ch2 ∈ R91, symbols "/" and "%" are the operators used in the C language, representing integral division and modulo division (remainder) respectively.

The operation of dividing the input message M into 13-bit long blocks may produce the last block less than 13-bit long. For such blocks, n bits are added to the specified side to make it become a complete block for implementing mapping; and a block of data $\phi$n (n=1, . . . ,12) is added thereafter as the input data implementing mapping so that it can be decided how many filling bits have to be deleted during decoding. When needed, double-character "==" may be used as a "terminating symbol" of the output character-string. Hence at most 92 printable ASCII characters can appear in the output of Base91 coding.

According to the coding rules of Base91 coding mentioned above, the number of extra added output data consisting of the image of the filling bits and their denoting symbols, and the "terminating symbol" does not exceed 6 characters. Therefore, with the increase of the bit number or byte number of the input message M, the average coding efficiency of the Base91 coding designed in the present invention approaches 81.25%, its data expansion rate approaches 123% (the coding efficiency of current Base64 coding is 75% and its data expansion rate is 133%).

Compared with the Base64 coding and QP coding, the present invention has its distinguishing feature in that the variable bit number of the block mapping of the transformation exceeds 6 or 8 and is not a multiple of 6 or 8, it is a particularly selected number 13. The design features of the three kinds of coding transformation are shown in Table 1.

Compared with current Base64 coding and QP coding, the present invention obviously increases the coding efficiency. When used in transferring information, the present invention can reduce channel occupation time, save transmission cost; when an arbitrary bit-string data is stored using printable character mode, the present invention can save storage space and cost. The comparison of the transformation performance is shown in Table 2.

TABLE 1

| design features | coding transformation | | |
|---|---|---|---|
| | QP coding (MSB of input byte is 1) | Base64 coding | Base91 coding |
| number of basic variable bits | 8 | 6 | 13 |
| number of bits occupied by image element | 24 | 8 | 16 |
| characteristic of message block or image | 1 byte/3 byte | image is single byte | image is double bytes |
| number of output various characters | 17 | 65 | 91 or 92 |
| number of elements of variable set | 256 | 64 | $2^{13} + 12$ |

TABLE 2

| performance features | coding transformation | | |
|---|---|---|---|
| | QP coding (MSB of input byte is 1) | Base64 coding | Base91 coding |
| coding efficiency | 33.333% | 75% | 81.25% |
| data expansion rate | 300% | 133% | 123% |
| time required for E-mail transmission of coded data with equal amount of messages | 225 | 100 | 92.3 |
| | 100 | 44.44 | 41.03 |
| storage space for coded data of equal amount of messages in printable character mode | 225 | 100 | 92.3 |

The (equal amount of) "messages" in Table 2 denotes the input of coding transformation, the data in the third row ("time required for E-mail transmission of coded data with equal amount of messages") means the results of calculation according to the coding method itself without considering other time overhead required for processing E-mails during a concrete network transmission.

BRIEF DESCRIPTION OF ACCOMPANYING DRAWING

The description of the accompanying drawing is as follows:

FIG. 1 is a flowchart of the computer algorithm of the Base91 coding of the present invention.

PREFERRED EMBODIMENT OF THE PRESENT INVENTION

The present invention will be explained below in more details in conjunction with FIG. 1.

An arbitrary bit-string of data is mapped into a sequence of printable characters, wherein the mapping method is implemented by the computer software and is characterized in employing the following steps of:

(1) powering on the computer (or the computer has been started by the application program using the present coding software);

(2) storing the executable program module to be used to execute the coding algorithm into the program storage of the computer system, transferring the output character set and filling bit denoting array prepared by the program into the memory and building the tables of R91_CH[91] and φ [13];

(3) preparing the arguments and assigning their initial values (performed by the program invoking the present module): make the pointer INP_STR pointing to the address of the byte-string to be transformed; INP Len= byte-length of the input byte-string, 32-bit (the bits from higher one to lower one are denoted by 31, 30, . . . ,1,0) unsigned integer variables x,W=0; set R, the number of the remaining untransformed bits in W, to zero, i.e. R=0; the output character-string OUT_STR is set to empty character-string; set OL, the length of output character-string, to zero, i.e.OL=0;

(4) make the program counting pointer pointing to the entry address of the previously described executable program module, reading instructions and executing coding transformation;

(5) executing the looping process of coding transformation as follows:

```
if(INP_Len>0) do
    { R^th through (R+7)^th bits of W ← read one byte from the address
INP_STR; R ← R+8; INP_STR ← INP_STR+1;
INP_Len ← INP_Len-1; }
until (R ≥ 13 or INP_Len==0)
    executing a coding transformation of 13-bit block:
    { x ← the lowest 13 bits of W;
    W>>13; (i.e. the remaining bits are kept at the lower end of W)
    R ← R-13;
    ch1 ← R91_CH[x/91]; ch2 ← R91_CH[x%91];
    Appending the characters ch1, ch2 to the output-string OUT_STR;
OL ← OL+2; }
    processing procedure when there are filling bits:
    if (R<0)
    { ← - R; (i.e. the n 0-bits at the higher end of the last block are
filling bits)
    x ← φ[n]; ch1 ← R91_CH[x/91]; ch2 ← R91_CH[x%91];
    Appending the characters ch1, ch2 to the output-string OUT_STR;
    OL ← OL+2; }
```

(6) the following operation is optional: appending the terminating characters "==" to OUT_STR and OL OL+2;

(7) finishing the execution of the coding transformation module.

After the completion of the execution of the coding transformation module, the output character-string is the character string stored in OUT_STR, and its length equal to value of OL.

[Embodiment] With reference to FIG. 1 and the previous—descriptions of the main technical features of the computer programs, first initializes the output character set of the particular mapping relation char R91$_{13}$CH[91]={'that is, the set of 91 characters selected from the 95 printable ASCII character set with "–", "=", "." and space character excluded, and the sequential order of those symbols in the ASCII table is not changed.

Hence the mapping rule is: R91_CH[0]='!', R91_CH[1]='"', ..., R91_CH[22]='9', ..., R91_CH[67]='g', ..., R91_CH[90]='~', etc. The filling bit denoting data are initialized as unsigned φ[13]={0, 8192, 8193, 8194, 8195, 8196, 8197, 8198, 8199, 8200, 8201, 8202, 8203};

The input message is expressed according to the decimal form of the 8-bit segmentation as unsigned char INP_STR[5]={255, 255, 252,254, 129}; wherein the byte-length of the input message INPlen=5, the output character-string is initialized as OUT_STR="" with its length OL=0. W is used to express the unsigned 32-bit variable with its bits denoted by 31, ..., 1, 0 from higher bit (the leftmost) to lower bit (the rightmost); R is used to count the number of the input bits which have been shifted into W but not yet divided into blocks and are always stored in the lowest R bits of W (the bits of newly read input byte are stored close to the left side of the original remaining bits in W). Do initialization W=0, R=0. The number with symbol "B" at the beginning is a binary number with its lower bits at the right end. In this example, the processing procedure corresponding to the looping body in the algorithm flow-chart of FIG. 1 is as follows:

(1) storing INP_STR[0]=255 into the lowest 8 bits of W and obtaining W=B0...011111111, R=8, INP_Len=4;

(2) storing INP_STR[1]=255 into the $8^{th}$ through $15^{th}$ bits of W, i.e. immediately to the left of the lowest R bits of W, and obtaining W=B0 ... 011111111 11111111,R16,INP_Len=3, at this time R≧13, taking out the lowest 13 bits of W to be x, wherein x=8191, W>>13 (i.e. the remaining bits are kept in the lowest bits of W, this is the same case below) and making W=B0...00000111, R=3, ch1=R91CH[x/91]=R91CH[90], ch2=R91_CH[x %91]=R91CH[1], OUT_STR="~", OL=2;

(3) storing INP_STR[2]=252 into $3^{rd}$ through $10^{th}$ bits of W and obtaining W=B0 ... 011111100111, R=11, INP_Len=2;

(4) storing INP_STR[3]=254 into the $11^{th}$ through $18^{th}$ bits of W and obtaining W=B0 ... 011111110 11111100111,R=19, INP_Len=1, at this time R≧13, taking out the lowest 13 bits of W to be x, wherein x=6119, W>>13 and making W=B0...00111111, R=6, ch1=R91_CH[x/91]=R91_CH[67], ch2=R91_CH[x %91]=R91_CH[22], OUT_STR="~" g9", OL=4;

(5) storing INP_STR[4]=129 into the $6^{th}$ through $13^{th}$ bits of W and obtaining W=B0 ... 010000001 111111, R=14, INP Len=0, at this time R≧13, taking out the lowest 13 bits of W to be x, wherein x=127, W>>13 and making W=B0 ... 00001, R=1, ch1=R91_CH[x/91]= R91_CH[1], ch2=R91_CH[x %91]=R91_CH[36], OUT_STR="~g9"H", OL=6;

(6) since INP_Len=0, taking x=W=1 as a complete 13-bit set (i.e. filling in 12 0-bits to the left of the remaining bit), R=R−13=−12, ch1=R91_CH[x/91]=R91_CH[0], ch2=R91_CH[x %91]=R91_CH[1], OUT_STR= "~g9"H! "", OL=8;

(7) since R<0, knowing that n=−R=12 is the number of filling bits (to the left of the effective data), using φ[12]=8203 to denote the number of the filling bits and mapping it as follows:
x=8203,
ch1=R91_CH[x/91]=R91 _CH[90],
ch2=R91_CH[x %91]=R91CH[13],
OUT_STR="~"g9"H!"O",OL=10;
(the looping processing procedure is ended)

At last, "==" is appended to the output-string, if one like. Therefore, for the given input data, the output of Base91 coding OUT_STR is the printable character-string "~g9"H!"~0" or "~"g9"H!"0==" with its length OL equal to 10 or 12. For implementing the Base91 decoding transformation, what necessary is only to operate in the reversed order and remember to remove the filling bits according to φ[12] and terminating symbol "==" which is has no original image.

What is claimed is:

1. A coding transformation method, used to transform an arbitrary input bit-string data into a sequence of printable ASCII characters, the coding transformation being implemented by the computer software, characterized in:

(a) storing an executable program module to be used to execute the coding transformation into the program storage of the computer system, and building the output character set R91_CH[91] in the computer memory and filling in the table of the bit denoting array φ[13];

(b) makes the input byte-string pointer pointing to a starting address of the byte-string to be coded, recording the length of the byte-string to be coded by using a variable, make the program counting pointer pointing to the entry address of a previously described executable program module in the program storage, reading the instruction and executing coding transformation;

(c) the coding transformation divides the input data into blocks with the length of 13 bits, (d) for the coding transformation of blocks, the variable set or the original image set X includes all 8192 13-bit symbols and 12 filling-bit denoting symbols φ1, ..., φ12, totally amounting to 8204 elements;

(e) using 91 or 92 (considering the terminating symbol "=") printable ASCII characters in the output representation of the coding transformation, (f) for the coding transformation of blocks, the image set Y is the sub-set of the direct product R91×R91, wherein R91 is the set of 91 printable characters, in particular R91 excluding printable ASCII characters "−" and "=", the reversible coding mapping relationship is $$\text{Base91}[x]=(ch1, ch2)=(R91\_CH[x/91], R91\_CH[x\%91])$$

wherein x∈X, ch1, ch2∈R91, symbols "/" and "%" are the operators used in the C language, representing integral division and modulo division (remainder) respectively;

(g) for the input data block less than 13-bit long, adding n bits to the specified side to make it become a complete block for implementing mapping, thereafter adding a block of data φn as the input data block implementing mapping, its image is in the direct product R91×R91.

2. A coding transformation method, implemented by a computer operating a software program, for transforming an arbitrary input bit-string data into a sequence of printable ASCII characters, comprising:

(a) storing an executable program module to be used to execute the coding transformation into the program storage of the computer system, building the output character set R91_CH[91] in the computer memory, and filling in the table of the bit denoting array φ[13];

(b) making the input byte-string pointer to point to a starting address of the byte-string to be coded, recording the length of the byte-string to be coded by using a variable, making the program counting pointer to point to the entry address of a previously described executable program module in the program storage, reading an instruction, and executing coding transformation;

(c) dividing the input data into blocks with the length of 13 bits, wherein for the coding transformation of blocks, the variable set or the original image set X includes all 8192 13-bit symbols and 12 filling-bit denoting symbols $\phi 1, \ldots, \phi 12$, which totally amount to 8204 elements;

(d) using 91 or 92 printable ASCII characters in the output representation of the coding transformation while considering the terminating symbol "=", wherein for the coding transformation of blocks, the image set Y is the sub-set of the direct product R91×R91, with R91 being a set of 91 printable ASCII characters, in particular R91 excluding printable ASCII characters "−" and "=", and the reversible coding mapping relationship being $$Base91[x]=(ch1, ch2)=(R91\_CH[x/91], R91\_CH[x\%91])$$

where $x \in X$, ch1, ch2$\theta$R91, and symbols "/" and "%" being the operators used in the C language and representing integral division and module division (remainder) respectively; and (e) for the input data block less than 13-bit long, adding n bits to the specified side to make it become a complete block for implementing mapping, thereafter adding a block of data $\phi n$ as the input data block implementing mapping, with the image of the block of data $\phi n$ being in the direct product R91×R91.

3. A coding transformation method, implemented by a software program executed by a computer, for transforming an arbitrary input bit-string data into an output sequence of printable ASCII characters, said method comprising the steps of:

(a) building an output character set R91__CH[91] and filling in a table of the bit denoting array $\phi[3]$;

(b) making an input byte-string pointer point to a starting address of an input data byte-string to be coded and recording the length of the byte-string to be coded in a variable;

(c) dividing the input data into blocks with the length of 13 bits, wherein the input data set X can include all 8192 13-bit symbols and 12 filling-bit denoting symbols $\phi 1, \ldots, \phi 12$ which totally amount to 8204 elements;

(d) using 91 printable ASCII characters in an output representation of the coding transformation, or 92 printable ASCII characters if considering the terminating symbol "=", wherein the output image set Y is a sub-set of the direct product R91×R91, with R91 being the set of 91 printable ASCII characters, in particular R91 excluding printable ASCII characters "−" and "=", and the reversible coding mapping relationship being $$Base91[x]=(ch1, ch2)=(R91\_CH[x/91], R91\_CH[x\%91])$$

where $x \in X$, ch1, ch2$\in$R91, and symbols "/" and "%" are the operators used in the C language to represent integral division and modulo division (remainder) respectively; and (e) for an input data block less than 13-bits long, adding n bits to the specified side to make it become a complete block for implementing the mapping, thereafter adding a block of data $\phi n$ as the input data block implementing the mapping, with the image of the block of data $\phi n$ being in the direct product R91×R91.

4. The coding transformation method of claim 3, further comprising the steps of:

storing an executable program module to be used to execute the coding transformation into a program storage of the computer system;

making a program counting pointer point to an entry address of the executable program module;

reading an instruction; and executing the coding transformation executable program module.

\* \* \* \* \*